US011093010B2

(12) United States Patent
Keilers et al.

(10) Patent No.: US 11,093,010 B2
(45) Date of Patent: Aug. 17, 2021

(54) EXPANSION MODULE SYSTEM

(71) Applicant: Dell Products L.P., Round Rock, TX (US)

(72) Inventors: Cyril Adair Keilers, Georgetown, TX (US); Shawn Paul Hoss, Georgetown, TX (US); Christopher Michael Helberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 139 days.

(21) Appl. No.: 16/692,806

(22) Filed: Nov. 22, 2019

(65) Prior Publication Data

US 2020/0089289 A1 Mar. 19, 2020

Related U.S. Application Data

(63) Continuation of application No. 15/987,752, filed on May 23, 2018, now Pat. No. 10,488,893.

(51) Int. Cl.
*G06F 1/18* (2006.01)
*H05K 7/14* (2006.01)
*H01R 12/73* (2011.01)

(52) U.S. Cl.
CPC .............. *G06F 1/185* (2013.01); *G06F 1/186* (2013.01); *G06F 1/189* (2013.01); *H05K 7/1402* (2013.01); *H01R 12/732* (2013.01)

(58) Field of Classification Search
CPC .......... G06F 1/185; G06F 1/186; G06F 1/189; H05K 7/1402; H01R 12/732
See application file for complete search history.

(56) References Cited

U.S. PATENT DOCUMENTS

| | | | |
|---|---|---|---|
| 7,335,032 B1 * | 2/2008 | Lee | G06F 1/185 |
| | | | 439/76.1 |
| 9,564,712 B1 | 2/2017 | Shih | |
| 9,778,708 B1 * | 10/2017 | Meserth | G06F 1/185 |
| 9,899,358 B2 * | 2/2018 | Tate | G11C 5/04 |
| 10,103,466 B1 * | 10/2018 | Sporer | H05K 1/141 |
| 10,488,893 B1 * | 11/2019 | Keilers | G06F 1/185 |
| 2008/0298040 A1 | 12/2008 | Lee | |
| 2016/0259754 A1 | 9/2016 | Ping | |

FOREIGN PATENT DOCUMENTS

| | | | | |
|---|---|---|---|---|
| WO | 2016018326 A1 | | 2/2016 | |
| WO | WO-2016018326 A1 * | | 2/2016 | ............... G06F 1/16 |

\* cited by examiner

*Primary Examiner* — Nidhi Thaker
(74) *Attorney, Agent, or Firm* — Haynes and Boone, LLP

(57) ABSTRACT

An expansion module system includes a board having a plurality of expansion modules connectors mounted to the board. A shared expansion module coupling feature is provided on the board and includes a coupling member. A respective expansion module is connected to each of the plurality of expansion module connectors, and the coupling member engages each of the respective expansion modules to secure each of the respective expansion modules in their respective expansion module connectors. The shared expansion module coupling feature may includes a standoff that is mounted to the board immediately adjacent a single hole defined by the board, and the coupling member may be provided by a single screw that engages each of the respective expansion modules and at least one of: the shared expansion module coupling feature and the portion of the board that defines the hole.

20 Claims, 15 Drawing Sheets

EXPANSION MODULE SYSTEM

RELATED APPLICATIONS

The present application is a continuation application of U.S. patent application Ser. No. 15/987,752 filed on May 23, 2018, the disclosure of which is incorporated herein by reference in its entirety.

BACKGROUND

The present disclosure relates generally to information handling systems, and more particularly to connecting expansion module(s) to information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize expansion modules such as, for example, M.2 expansion cards and/or other expansion modules known in the art. The M.2 specification, which was formerly known as the Next Generation Form Factor (NGFF), defines internally mounted expansion cards and their associated connectors, and was provided to replace the mini Serially Advanced Technology Attachment (mSATA) standard that utilized the Peripheral Component Interconnect express (PCIe) mini card physical card layout and connectors. The M.2 specification is flexible, allowing different M.2 module widths and lengths and providing relatively advanced interfacing features that provide particular benefits in small computing devices such as ultrabooks (i.e., relatively small laptop/notebook computing devices), tablet devices, and/or other computing devices known in the art. However, the M.2 specification raises some issues with the mounting, power delivery, and data transmission ability of M.2 modules in computing devices.

For example, M.2 modules are typically coupled to a board in the computing devices via an M.2 connector and a coupling feature on the board. That coupling feature is conventionally provided by a hole defined in the board, and a standoff mounted to the board immediately adjacent the hole. As such, a first end of the M.2 module may be coupled to the M.2 connector, and a second end of the M.2 module that is opposite the first end is then supported by the standoff, with a screw or other coupling device provided in the standoff and/or hole and engaged with the M.2 module to secure the M.2 module on the board and in the M.2 connector. Thus, for each M.2 module conventionally provided on the board, a respective hole and standoff is provided on that board in order to secure that M.2 module on the board and to its M.2 connector, which utilizes board space for holes and standoff mounting locations that could otherwise provide traces in the board and/or mounting locations for other components on the board, and generally provides for inefficient M.2 module placement on the board. Furthermore, the power delivery from the board to the M.2 module and data transmission between the M.2. module and the board are also limited by the bandwidth of the M.2 module/ M.2 connector connections (i.e., power delivery is limited by the power bandwidth of the power connection between the M.2 module and the M.2 connector, and data transmission is limited by the data bandwidth of the data connection between the M.2 module and the M.2 connector.)

Accordingly, it would be desirable to provide an improved expansion module system.

SUMMARY

According to one embodiment, an Information Handling System (IHS) includes a board; a plurality of expansion modules connectors mounted to the board; and a shared expansion module coupling feature provided on the board and including a coupling member that is configured to engage each of a plurality of expansion modules when those expansion modules are each connected to a respective one of the plurality of expansion module connectors.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
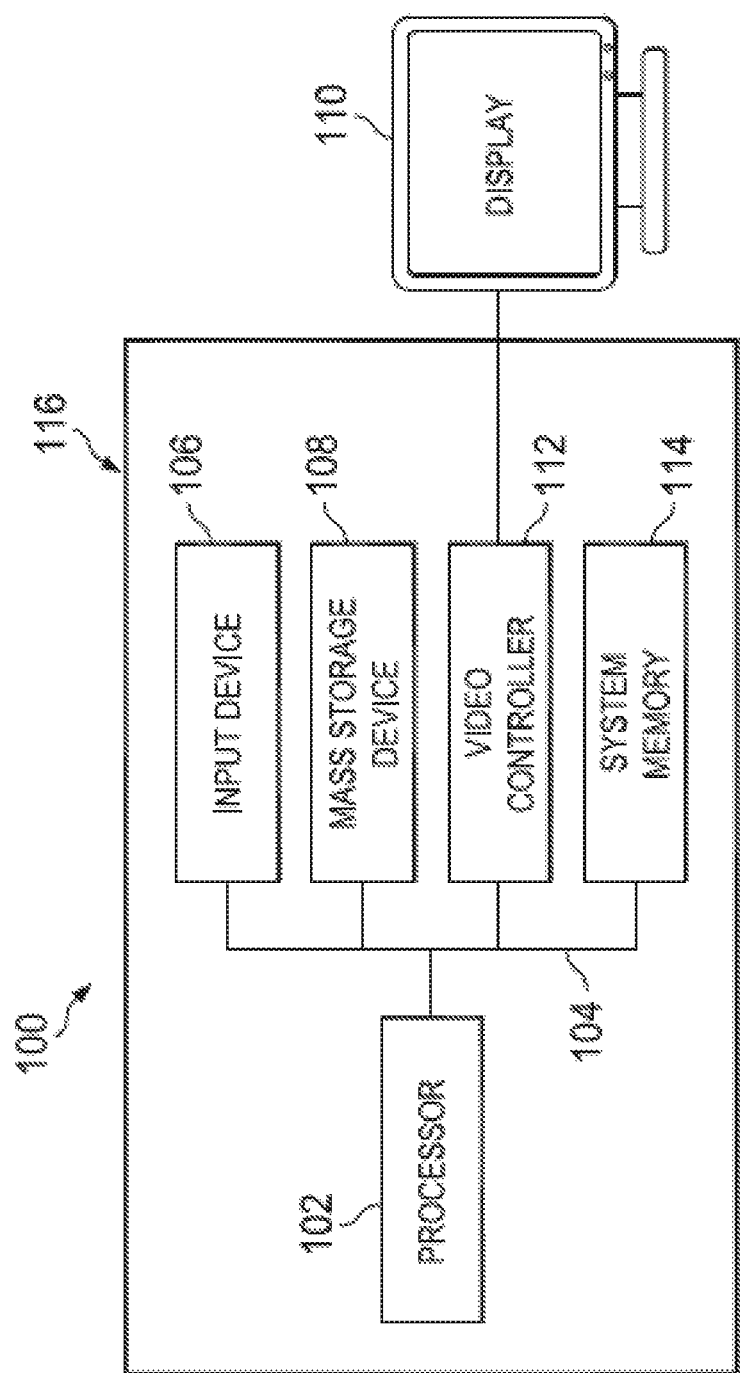
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
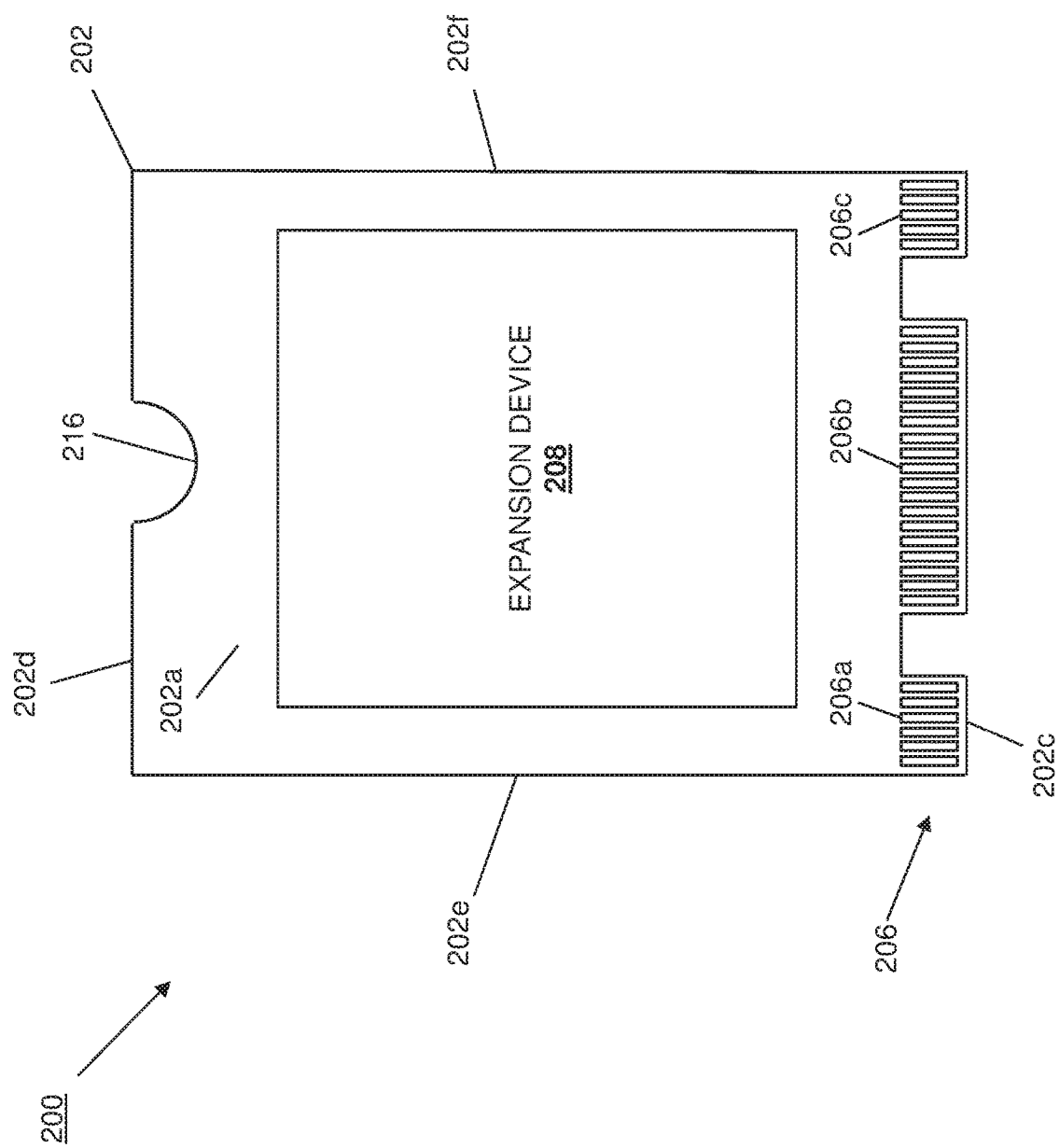
FIG. 2A is a top schematic view illustrating an embodiment of an expansion module.
Figure 2B:
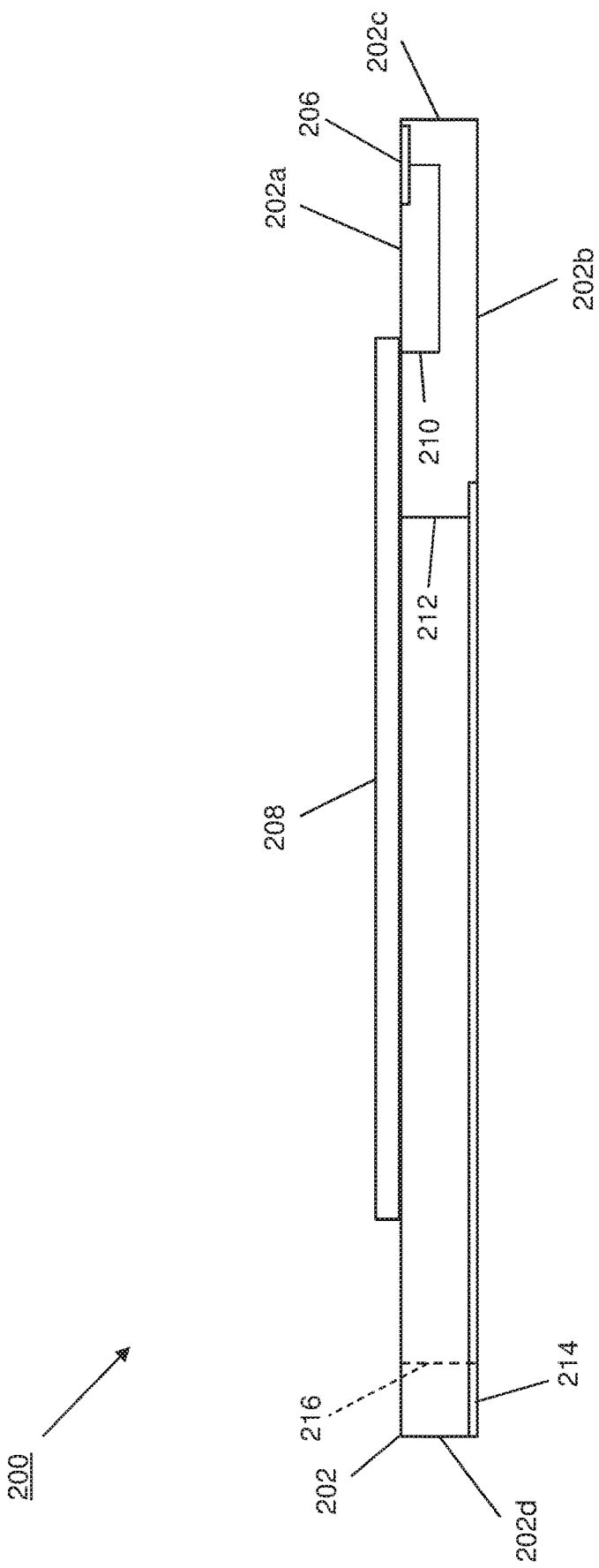
FIG. 2B is a side schematic view illustrating an embodiment of the expansion module of FIG. 2A.

Referring now to FIGS. 2A and 2B, an embodiment of a conventional expansion module 200 is illustrated. In an embodiment, the expansion module 200 is an M.2 expansion card provided according to the M.2 specification, although other expansion cards and/or modules may benefit from the teachings of the present disclosure and thus will fall within its scope as well. In the illustrated embodiment, the expansion module 200 includes an expansion board 202 having a top surface 202a, a bottom surface 202b located opposite the expansion board 202 from the top surface 202a, a front edge 202c extending between the top surface 202a and the bottom surface 202b, a rear edge 202d extending between the top surface 202a and the bottom surface 202b and located opposite the board 202 from the front edge 202c, and a pair of opposing side edges 202e and 202f extending between the top surface 202a, the bottom surface 202b, the front edge 202c, and the rear edge 202d, and located opposite the board 202 from each other. A connector edge 206 is included on the board 202 immediately adjacent the front edge 202c, and includes a plurality of connector pads 206a, 206b, and 206c. For example, in embodiments in which the expansion module 200 is an M.2 expansion card, the connector pads 206a and 206b may provide an "M key" edge connector, the connector pads 206b and 206c may provide a "B key" edge connector, and the connector pads 206a, 206b, and 206c may provide a "B & M key" edge connector. An expansion device 208 is mounted to the expansion board 202, and includes a power coupling 210 to power connector pad(s) on the connector edge 206, and a ground coupling 212 to a ground connector pad 214 that is included in the board 202 adjacent the bottom surface 202b. In the illustrated embodiment, the board 202 defines an expansion module securing feature 216 that extends into the board 202 from the rear surface 202d, although one of skill in the art in possession of the present disclosure will recognize that other securing features provided according to the teachings of the present disclosure may fall within its scope as well.

Figure 3:
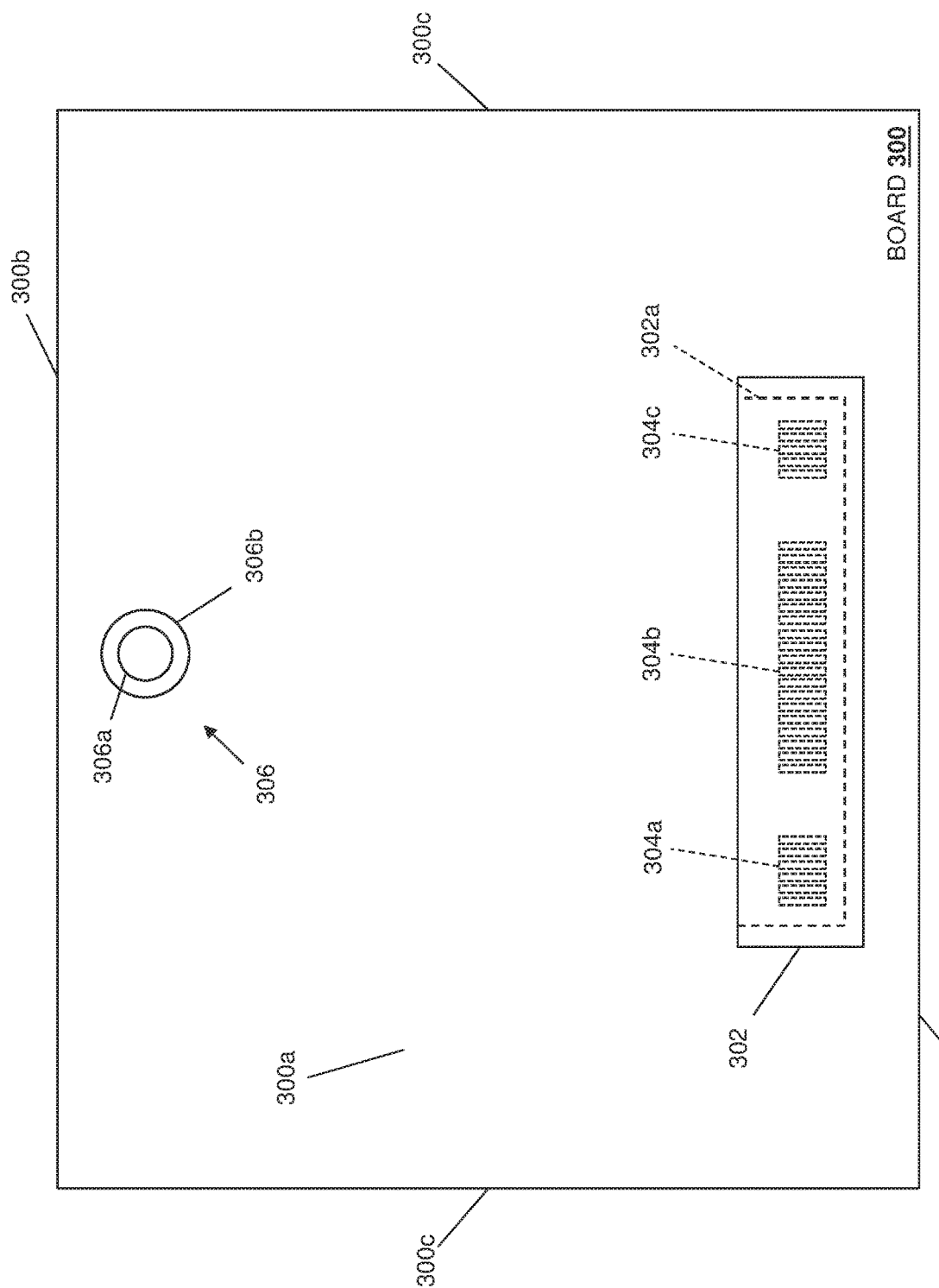
FIG. 3 is a top schematic view illustrating an embodiment of a conventional board including a conventional expansion module connector and a conventional expansion module coupling feature.

Referring now to FIG. 3, an embodiment of a conventional board 300 is illustrated. In an embodiment, the board 300 is a motherboard, although other board may benefit from the teachings of the present disclosure and thus will fall within its scope as well. In the illustrated embodiment, the board 300 includes a top surface 300a, a front edge 300b, a rear edge 300c located opposite the board 202 from the front edge 300b, and a pair of opposing side edges 300d and 300e extending between the top surface 300a, the front edge 300b, and the rear edge 300c, and located opposite the board 300 from each other. A conventional expansion module connector 302 is mounted to the board 300 adjacent the front edge 300a, defines an expansion module connector slot 302a, and includes a plurality of connector pads 304a, 304b, and 304c. For example, in embodiments in which the expansion module connector 302 is an M.2 card connector, the connector pads 304a and 304b may provide a socket for an "M key" edge connector, the connector pads 206b and 206c may provide a socket for a "B key" edge connector, and the connector pads 206a, 206b, and 206c may provide a socket for a "B & M key" edge connector. In the illustrated embodiment, the board 300 includes a conventional expansion module coupling feature 306 that includes a hole 306a that is defined by the board 300 and that extends into (and in many cases, through) the board 300, and a standoff 306b that is mounted to the board 300 adjacent the hole 306a.

Figure 4:
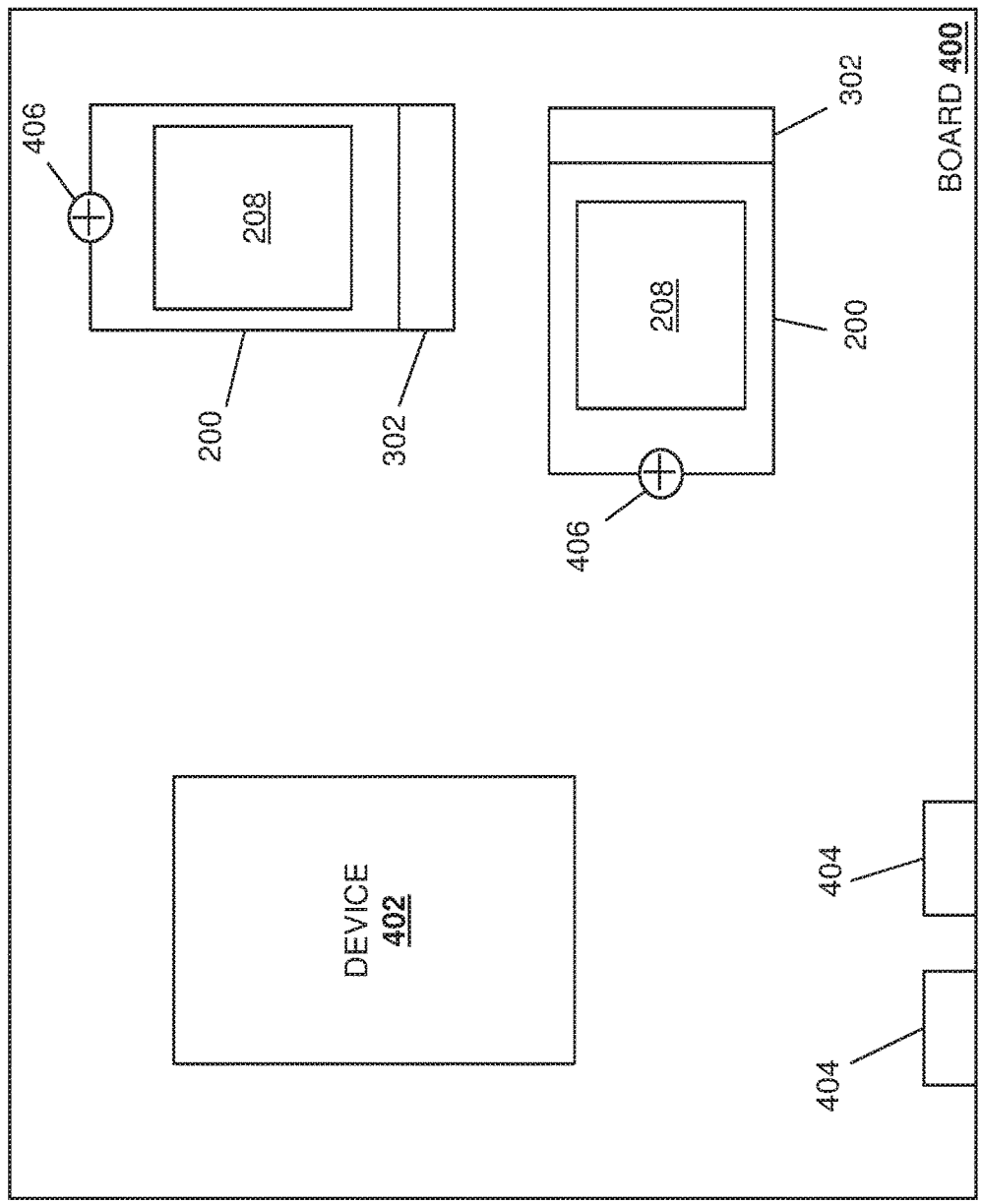
FIG. 4 is a top schematic view illustrating an embodiment of conventional expansion modules coupled to a conventional board with conventional expansion module connectors and conventional expansion module coupling features.

With reference to FIG. 4, an embodiment of conventional expansion modules (e.g., M.2 expansion cards in the illustrated embodiment) coupled to a conventional board with conventional expansion module connectors (e.g., M.2 expansion card connectors) and conventional expansion module coupling features (e.g., M.2 expansion card coupling features) is illustrated. In the illustrated embodiment, a board 400 includes conventional expansion module connectors 302 with respective conventional expansion module coupling features (e.g., not illustrated, but substantially similar to the conventional expansion module coupling feature 306 discussed above with reference to FIG. 3.) The board 400 also includes a device 402 (e.g., a processing system, memory system, and/or other computing device component known in the art) and connectors 404 that are mounted to the board 400, any or all of which may be coupled to the connectors 302 through the board 400 (e.g., via traces in the board 400.) A respective conventional expansion module 200 is connected to each conventional expansion module connector 302 (e.g., via the positioning of the connector edge 206 on each conventional expansion module 200 in the expansion module connector slot 302a on its respective conventional expansion module connector 302), and secured to that conventional expansion module connector 302 and the board 400 via a coupling member 406 (e.g., a screw in the illustrated embodiment) that engages the standoff 306b and the hole 306a (e.g., threads defined by the standoff 306b and the hole 306a) provided by the conventional expansion module coupling feature 306. As can be seen, a conventional expansion module coupling feature 306 is provided for each of the conventional expansion module connectors 302, and the inventors of the present disclosure have found that doing so provides for inefficient expansion module placement on the board 400, as well as uses up area on the board 400 (e.g., for defining the hole 306a and mounting the standoff 206b) that could otherwise be used for other board or computing device components.

Figure 5A:
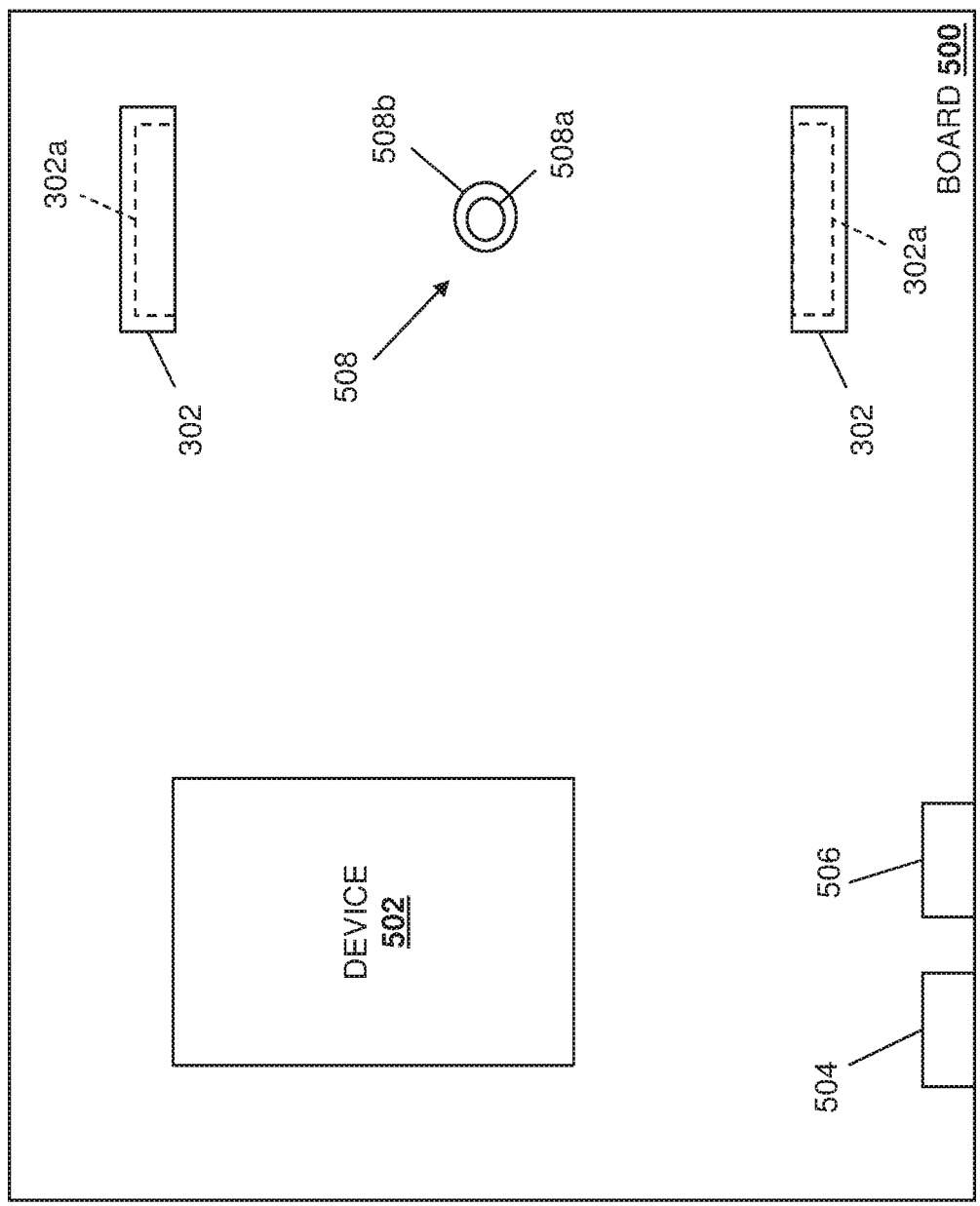
FIG. 5A is a top schematic view illustrating an embodiment of a board including expansion module connectors and a shared expansion module coupling feature of the present disclosure.
Figure 5B:
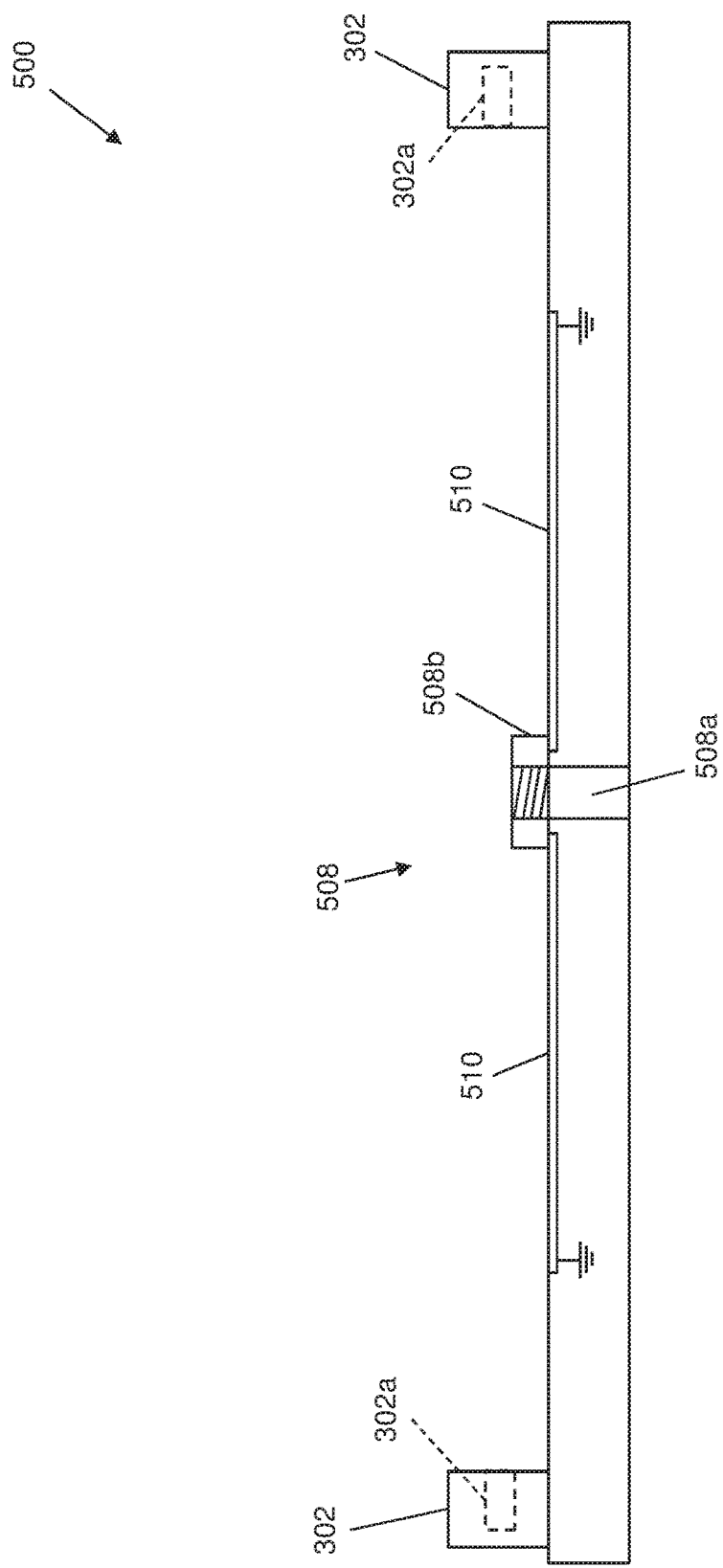
FIG. 5B is a side schematic view illustrating an embodiment of the board of FIG. 5A including the expansion module connectors and the shared expansion module coupling feature of the present disclosure.

Referring now to FIGS. 5A and 5B, an embodiment of a board 500 provided according to the teachings of the present disclosure is illustrated. In the illustrated embodiment, the board 500 includes expansion module connectors 302 that each define the expansion module connector slots 302a discussed above with reference to FIG. 3. While not illustrated, each of the expansion module connectors 302 may include the plurality of connector pads 304a, 304b, and 304c as well. The board 500 also includes a device 502 (e.g., a processing system, memory system, and/or other computing device component known in the art) and connectors 504 and 506 that are mounted to the board 500, any or all of which may be coupled to the connectors 502 through the board 500 (e.g., via traces in the board 500.) As can be seen in the illustrated embodiment, the expansion module connectors 302 are oriented on the board 500 such that their expansion module connector slots 302a face each other (i.e., a first expansion module connector slot 302a defined by a first expansion module connector 302 faces a second expansion module connector slot 302a defined by a second expansion module connector 302.) A shared expansion module coupling feature 508 is provided on the board 500 and between the expansion module connectors 302, and includes a hole 508a that is defined by the board 500 and that extends through the board 500, and a standoff 508b that is mounted to the board 500 adjacent the hole 508a. In the illustrated embodiment, the standoff 508b defines a threaded hole that is substantially coaxial with the hole 508a. The standoff 508b is electrically coupled to ground connector pads 510 that may be grounded, as illustrated, using a variety of techniques known in the art. However, while a specific shared expansion module coupling feature and orientation of the expansion module connectors have been illustrated and described, one of skill in the art in possession of the present disclosure will recognize that the shared expansion module coupling feature may utilize different components, and/or the orientation of the expansion module connectors may be modified, while remaining within the scope of the present disclosure.

Figure 6:
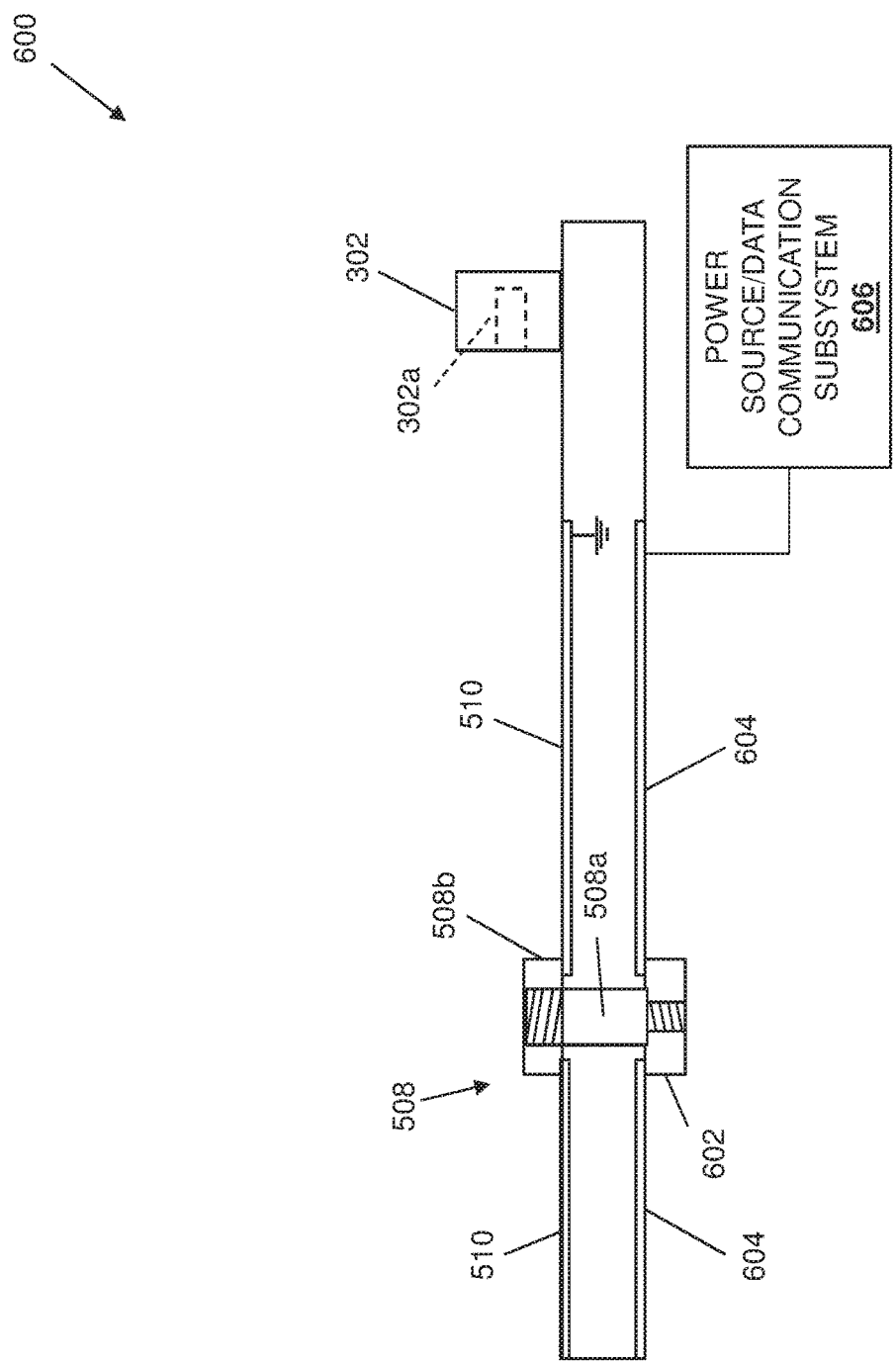
FIG. 6 is a side schematic view illustrating an embodiment of a board having a board supplemental power delivery/data transmission subsystem.

Referring now to FIG. 6, an embodiment of a board 600 provided according to the teachings of the present disclosure is illustrated. In the illustrated embodiment, the board 600 includes similar features as the board 500 discussed above with reference to FIGS. 5A and 5B, and thus common element numbers are used to identify similar features. However, while the supplemental power delivery/data transmission features are illustrated and discussed below as provided, at least in part, using the shared expansion module coupling feature 508 of the embodiment of FIGS. 5A and 5B, one of skill in the art in possession of the present disclosure will recognize that those supplemental power delivery/data transmission features may be provided in the board 300 (e.g., utilizing, at least in part, the expansion module coupling feature 306 of FIG. 3) while remaining within the scope of the present disclosure as well. As can be seen, a supplemental power delivery/data transmission coupling feature 602 is mounted to the board 600 opposite the board 800 from the shared expansion module coupling feature 508. In the illustrated embodiment, the supplemental power delivery/data transmission coupling feature 602 defines a threaded hole that is substantially coaxial with the hole 508a defined by the board 600. Furthermore, the supplemental power delivery/data transmission coupling feature 602 is connected to power delivery/data transmission lines 804 that are further connected to a power source/data communication subsystem 606 that may be provided by, for example, a power subsystem in a computing device that utilizes the teachings of the present disclosure (e.g., that delivers power to a processor and/or other components in the computing device), a data communication subsystem in a computing device that utilizes the teachings of the present disclosure (e.g., that provides for data communications from the processor or other components coupled to the processor), and/or a variety of other power sources and/or data transmission subsystems that would be apparent to one of skill in the art in possession of the present disclosure. Thus, while the power source/data communication subsystem 606 is illustrated as separate from the board 600, that power source/data communication subsystem 606 may be integrated with the board 600 while remaining within the scope of the present disclosure as well.

One of skill in the art in possession of the present disclosure will recognize that the supplemental power delivery subsystems and the supplemental data transmission subsystems are discussed interchangeably herein, as those subsystems may be utilized to deliver power, transmit data, or both. As such, power delivery lines and ground lines, data transmission lines and ground lines, and/or combinations thereof may be utilized to enable the supplemental power delivery/data transmission functionality of the present disclosure. While a specific power delivery/data transmission feature has been illustrated and described, one of skill in the art in possession of the present disclosure will recognize that power delivery/data transmission features according to the teachings of the present disclosure may vary while remaining within its scope as well.

Figure 7:
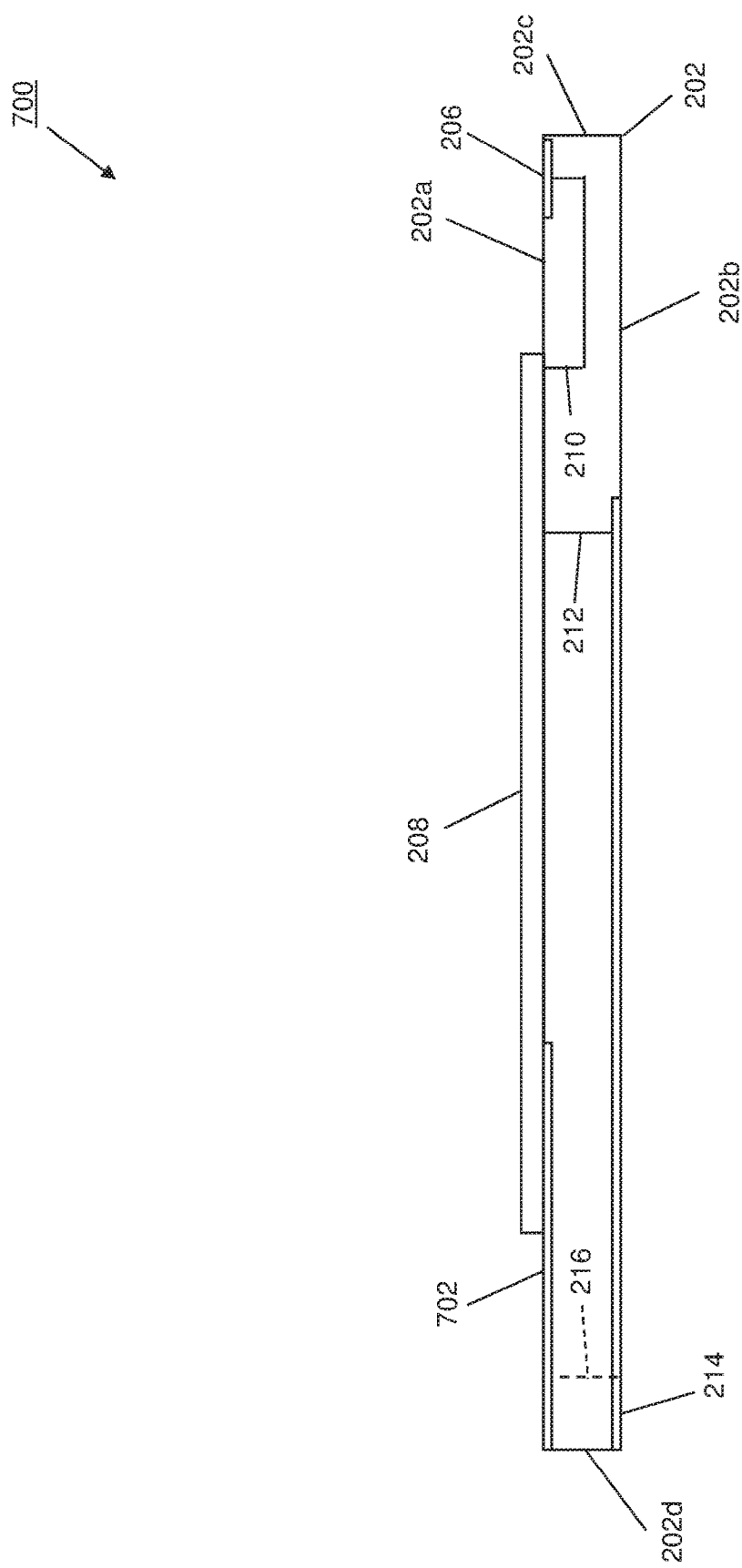
FIG. 7 is a side schematic view illustrating an embodiment of the expansion module of FIG. 2A having a module supplemental power delivery/data transmission system.

Referring not to FIG. 7, an embodiment of an expansion module 700 that may utilize the supplemental power delivery/data transmission features provided in the board 600 of FIG. 6 is illustrated. In the illustrated embodiment, the expansion module 700 includes similar features as the expansion module 200 discussed above with reference to FIGS. 2A and 2B, and thus common element numbers are used to identify similar features. However, the expansion module 700 is also provided with a power delivery line 702 that is located adjacent the top surface 202a of the expansion module 700 and that is connected to the expansion device 208. While a specific power delivery/data transmission feature on the expansion module 700 has been illustrated and described, one of skill in the art in possession of the present disclosure will recognize that power delivery/data transmission features according to the teachings of the present disclosure may vary while remaining within its scope as well.

Figure 8:
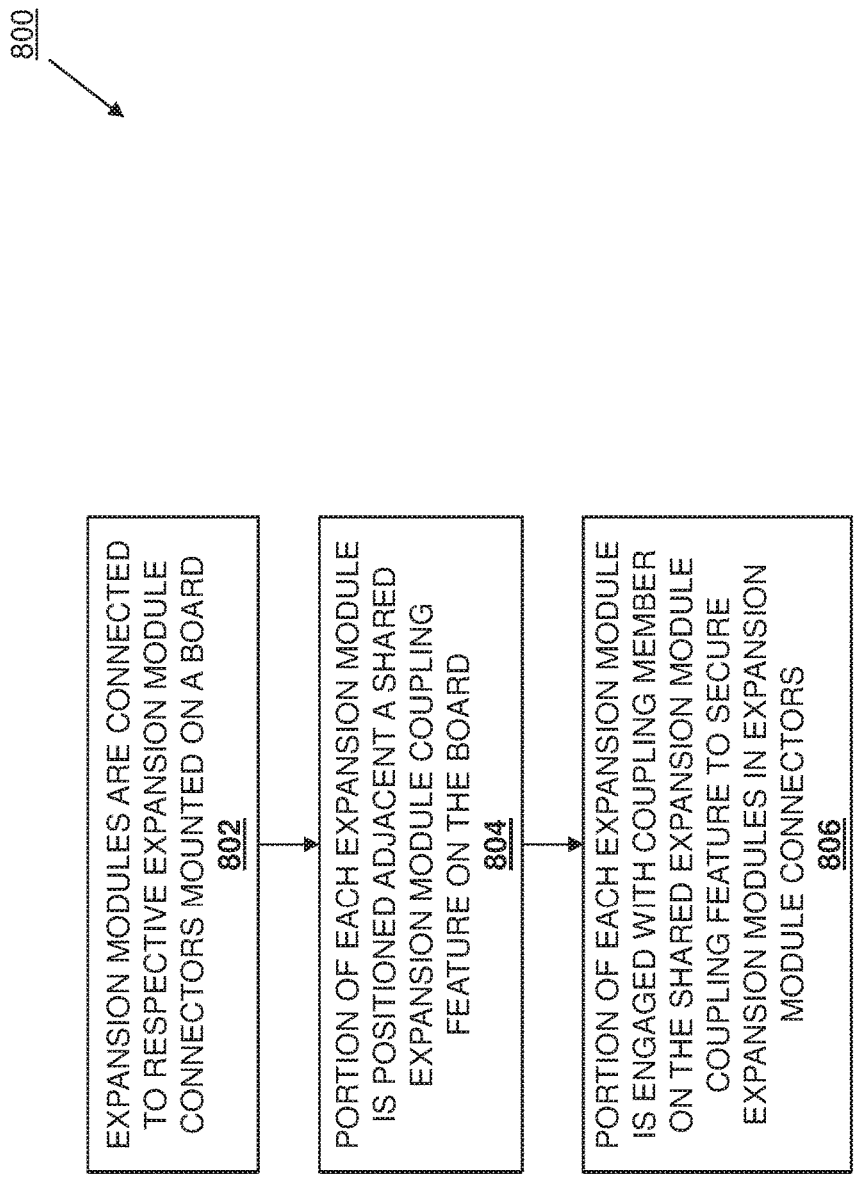
FIG. 8 is a flow chart illustrating an embodiment of a method for mounting expansion modules to a board.

Referring now to FIG. 8, an embodiment of a method 800 for mounting expansion modules to a board is illustrated. As discussed below, the systems and methods of the present disclosure provide a shared expansion module coupling feature on a board for use in supporting and engaging a plurality of expansion modules that are coupled to expansion module connectors on the board, which allows for single hole in the board and/or a single standoff mounted to the board to support and secure the plurality of expansion modules. In a specific examples, a pair of expansion modules connectors may be oriented on the board such that they face each other, with the shared expansion module coupling feature located between the pair of expansion module connectors, which allows a first expansion module and a second expansion module to be connected to respective ones of the pair of expansion module connectors, and a single coupling member to engage each of the first and second expansion modules, along with the shared expansion module coupling feature, to secure the first and second expansion modules to the board and in their respective expansion module connectors. As such, a two expansion module enabled system may be provided using a single hole and/or single standoff mounted to the board, providing for more efficient positioning of the expansion modules on the board (i.e., using up less board space relative to conventional systems), and using less of the board that may then be utilized to route traces, mount components, and/or provide other board elements that would be apparent to one of skill in the art in possession of the present disclosure.

The method 800 begins at block 802 where expansion modules are connected to respective expansion module connectors on a board. In an embodiment, at block 802, a respective expansion module 200 of FIGS. 2A and 2B may be connected to each of the expansion module connectors 302 on the board 500 of FIG. 5. For example, the connector edge 206 on a first expansion module 200 may be positioned adjacent a first expansion module connector slot 302a on a first expansion module connector 302 (e.g., at an angle, as is known in the art for some expansion module/expansion module connector connections), and then moved towards the first expansion module connector 302 such that the connector edge 206 on the first expansion module 200 enters the first expansion module connector slot 302a on the first expansion module connector 302 to engage the connector pads 206a, 206b, and 206c with the connector pads 304a, 304b, and 304c. Similarly, the connector edge 206 on a second expansion module 200 may be positioned adjacent a second expansion module connector slot 302a on a second expansion module connector 302 (e.g., at an angle, as is known in the art for some expansion module/expansion module connector connections), and then moved towards the second expansion module connector 302 such that the connector edge 206 on the second expansion module 200 enters the second expansion module connector slot 302a on the second expansion module connector 302 to engage the connector pads 206a, 206b, and 206c with the connector pads 304a, 304b, and 304c.

The method 800 then proceeds to block 804 where a portion of each expansion module is positioned adjacent a shared expansion module coupling feature on the board. In an embodiment, at block 804, each respective expansion module 200 that was connected to each of the expansion module connectors 302 on the board 500 of FIG. 5 at block 802 is then engaged with the shared expansion module coupling feature 508. For example, the portion of the first expansion module 200 adjacent the expansion module securing feature 216 may be positioned adjacent the shared expansion module coupling feature 508 and in engagement with a portion of the standoff 508b (e.g., rotated from the coupling angle used to connect to the expansion module connector 302, towards the board 500, and into engagement with the standoff 508b, as is known in the art for some expansion module/expansion module connector connections). Similarly, the portion of the second expansion module 200 adjacent the expansion module securing feature 216 may be positioned adjacent the shared expansion module coupling feature 508 and in engagement with a portion of the standoff 508b (e.g., rotated from the coupling angle used to connect to the expansion module connector 302, towards the board 500, and into engagement with the standoff 508b, as is known in the art for some expansion module/expansion module connector connections). Thus, following block 804, each of the expansion modules 200 may be connected to respective expansion module connectors 302, in engagement with the standoff 508b on the shared expansion module coupling feature 508, and oriented substantially parallel to the board 500.

Figure 9A:
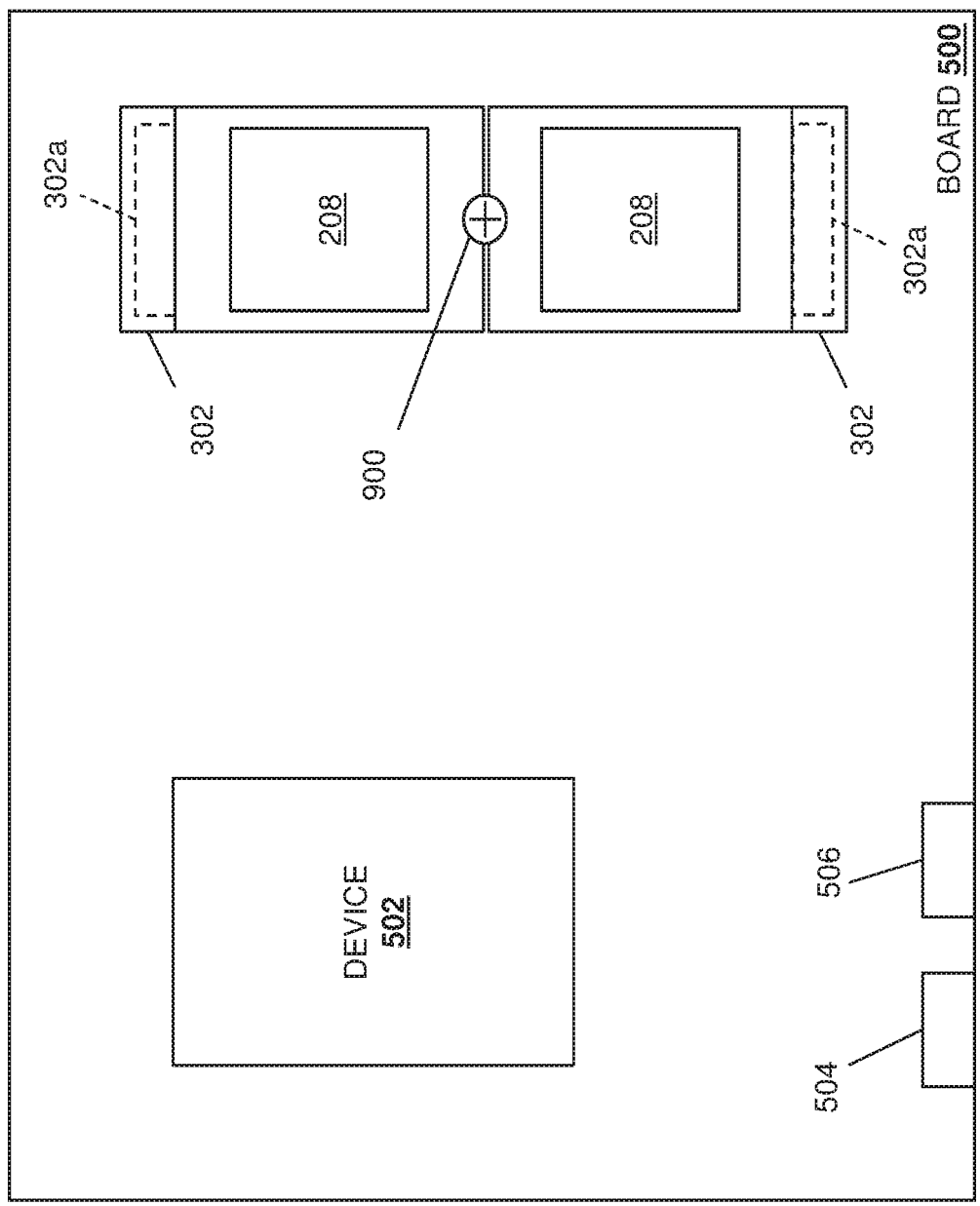
FIG. 9A is a top schematic view illustrating an embodiment of the board of FIGS. 5A and 5B with expansion cards of FIG. 2A coupled to respective expansion module connectors and secured using the shared expansion module coupling feature.
Figure 9B:
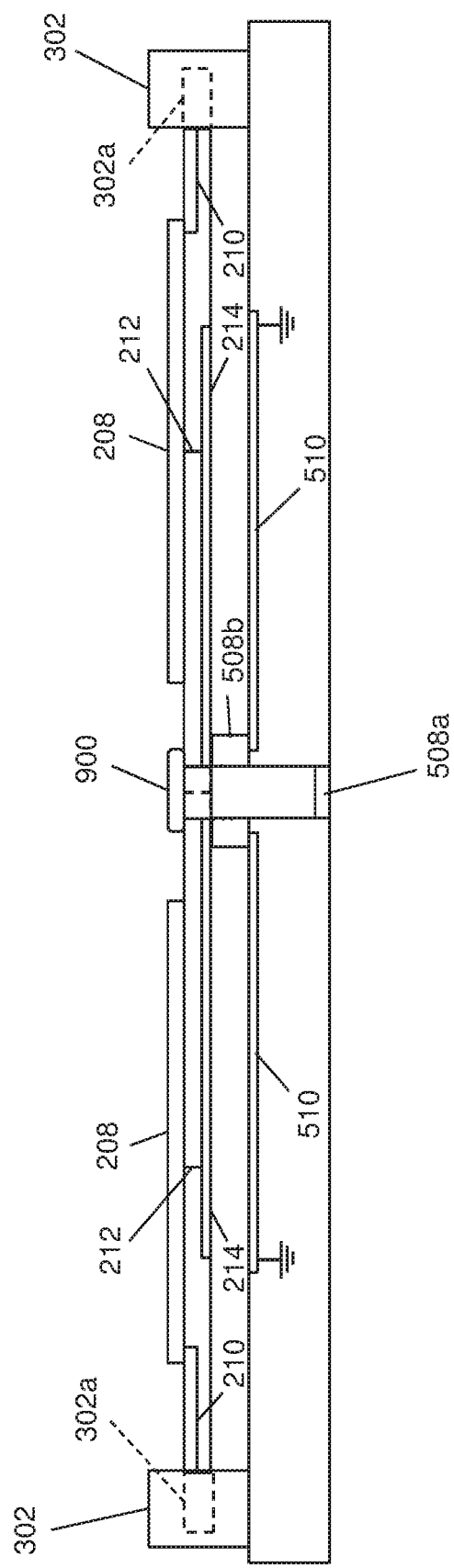
FIG. 9B is a side schematic view illustrating an embodiment of the board of FIGS. 5A and 5B with expansion cards of FIG. 2A coupled to respective expansion module connectors and secured using the shared expansion module coupling feature.

The method 800 then proceeds to block 806 where the portion of each expansion module is engaged by a coupling member on the shared expansion module coupling feature to secure the expansion modules in the expansion module connectors. With reference to FIGS. 9A and 9B, in an embodiment of block 806, a coupling member 900 may be engaged with the shared expansion module coupling feature 508 and the portion of each of the expansion modules 200 that is located adjacent the shared expansion module coupling feature 508. For example, the coupling member 900 may be provided by a screw that may be threaded with threads provided in the standoff 508b and/or the hole 508a until a top portion of that screw engages the portions of the first expansion module and the second expansion module adjacent the shared expansion module coupling feature 508 to secure those portions of the first expansion module and the second expansion module between the standoff 508b and the top portion of the screw, as illustrated in FIGS. 9A and 9B.

Thus, systems and methods have been described that provide a shared expansion module coupling feature on a board that supports and engages a plurality of expansion modules that are coupled to respective expansion module connectors on the board, which allows for single hole in the board and/or a single standoff mounted to the board to support and secure the plurality of expansion modules. In a specific examples, a pair of M.2 card connectors may be oriented on the board such that they face each other, with the shared M.2 card coupling feature located between the pair of M.2 card connectors, which allows a first M.2 card and a second M.2 card to be connected to respective ones of the pair of M.2 card connectors, and a single coupling member to engage each of the first and second M.2 cards, along with the shared M.2 card coupling feature, to secure the first and second M.2 cards to the board and in their respective M.2 card connectors. As such, a two M.2 card enabled system may be provided using a single hole and/or single standoff mounted to the board, providing for more efficient positioning of the M.2 cards on the board (i.e., using up less board space relative to conventional systems), and using less of the board that may then be utilized to route traces, mount components, and/or provide other board elements that would be apparent to one of skill in the art in possession of the present disclosure.

Figure 10:
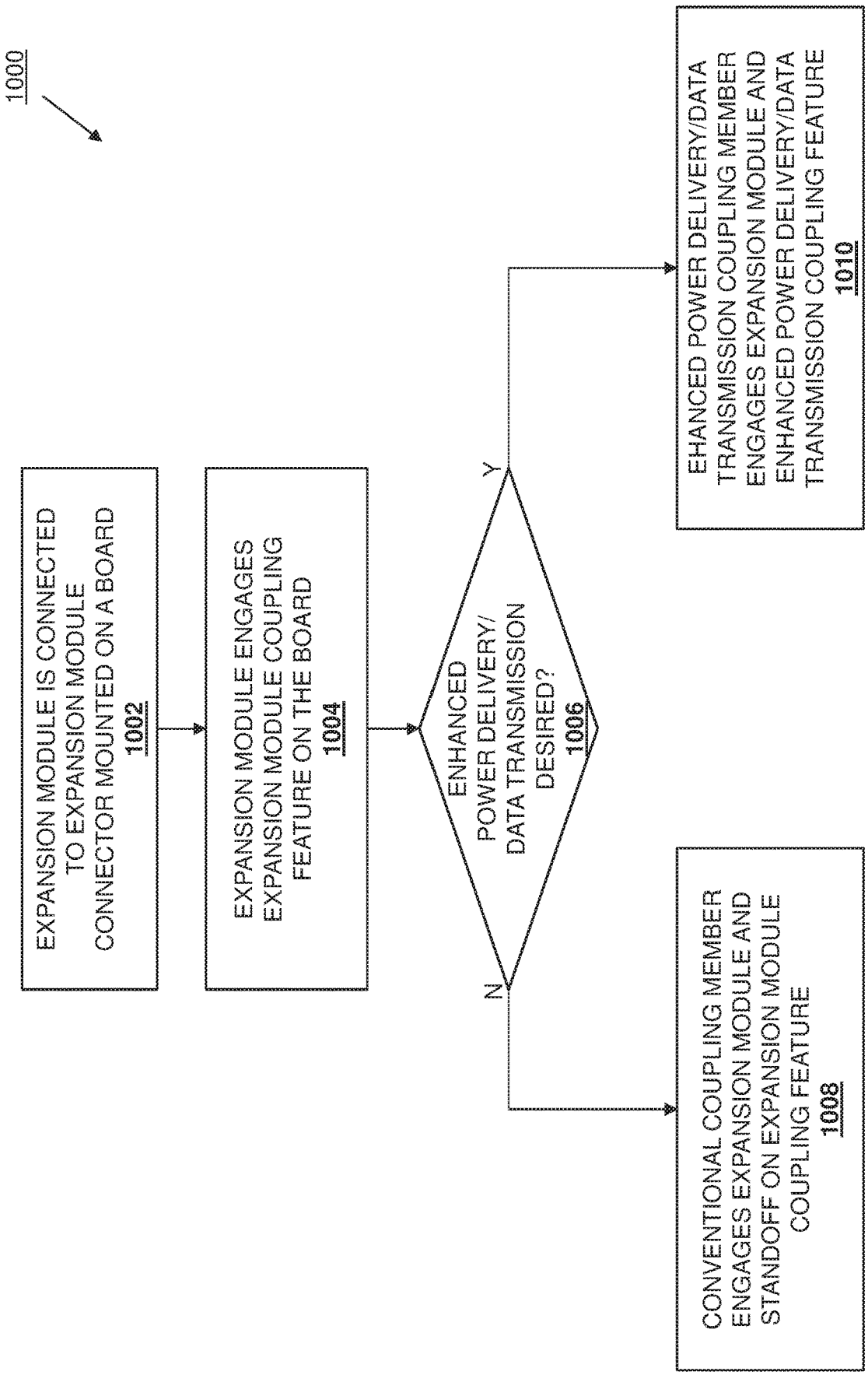
FIG. 10 is a flow chart illustrating an embodiment of a method for providing supplemental power/data to expansion modules on a board.

Referring now to FIG. 10, an embodiment of a method 1000 for providing supplemental power delivery and/or data transmission for expansion modules is illustrated. As discussed below, the systems and methods of the present disclosure provide for the delivery of additional power and/or the transmission of additional data to an expansion module via a secondary power delivery channel and/or secondary data transmission channel that is separate from the primary power delivery channel and primary data transmission channel provided by its expansion module connector. In a specific example, a board with which the expansion module is utilized may include an expansion module coupling feature that includes a hole that extends through the board, and a standoff that is located adjacent the hole. A supplemental power delivery/data transmission feature may be mounted to the board adjacent the hole and opposite the board from the standoff, and electrically coupled to a power source or data communication subsystem. When the expansion module is coupled to an expansion module connector on the board and engaged with the expansion module coupling feature, supplemental power delivery/data transmission may be enabled by utilizing an supplemental power delivery/data transmission coupling member that engages the expansion module (and a power delivery/data transmission line provided on the expansion module), along with the supplemental power delivery/data transmission feature, and without engaging the standoff. Engagement of the supplemental power delivery/data transmission coupling member with each of the power delivery/data transmission line on the expansion module and the supplemental power delivery/data transmission feature creates a power delivery/data transmission channel for providing the additional power/data between the expansion module and the power source or data communication subsystem. If supplemental power delivery/data transmission is not desired, a conventional coupling member may be utilized to secure the expansion module via engagement of the expansion module and the standoff, without engaging the supplemental power delivery/data transmission feature.

The method 1000 begins at block 1002 where an expansion module is connected to an expansion module connector on a board. In an embodiment, at block 1002, the expansion module 200 of FIGS. 2A and 2B or the expansion module 700 of FIG. 7 may be connected to the expansion module connector 302 on the board 600 of FIG. 6. For example, the connector edge 206 on the expansion module 200/700 may be positioned adjacent the expansion module connector slot 302a on the expansion module connector 302 (e.g., at an angle, as is known in the art for some expansion module/ expansion module connector connections), and then moved towards the expansion module connector 302 such that the connector edge 206 on the expansion module 200/700 enters the expansion module connector slot 302a on the expansion module connector 302 to engage the connector pads 206a, 206b, and 206c with the connector pads 304a, 304b, and 304c.

The method 1000 then proceeds to block 1004 where the expansion module engages an expansion module coupling feature on the board. In an embodiment, at block 1004, the expansion module 200/700 that was connected to the expansion module connector 302 on the board 600 of FIG. 6 at block 1002 is then engaged with the expansion module coupling feature 508. For example, the portion of the first expansion module 200 adjacent the expansion module securing feature 216 may be positioned adjacent the shared expansion module coupling feature 508 and in engagement with a portion of the standoff 508b (e.g., rotated from the coupling angle used to connect to the expansion module connector 320, towards the board 500, and into engagement with the standoff 508b, as is known in the art for some expansion module/expansion module connector connections).

The method 1000 then proceeds to decision block 1006 where it is determined whether supplemental power delivery/data transmission is desired. In an embodiment, at decision block 1006, a user may determine whether supplemental power delivery/data transmission is desired, and may configure the system accordingly. In particular, the user may select the conventional coupling member discussed below if the supplemental power delivery/data transmission is not desired, and may select the supplemental power delivery/ data transmission coupling member discussed below if the supplemental power delivery/data transmission is desired. Furthermore, as will be appreciated by one of skill in the art in possession of the present disclosure, the user may select the expansion module 200 and couple that expansion module 200 to the board 500 at blocks 1002 and 1004 if the supplemental power delivery/data transmission is not desired, and may select the expansion module 700 and couple that expansion module 700 to the board 500 at blocks 1002 and 1004 if the supplemental power delivery/data transmission is not desired.

Figure 11:
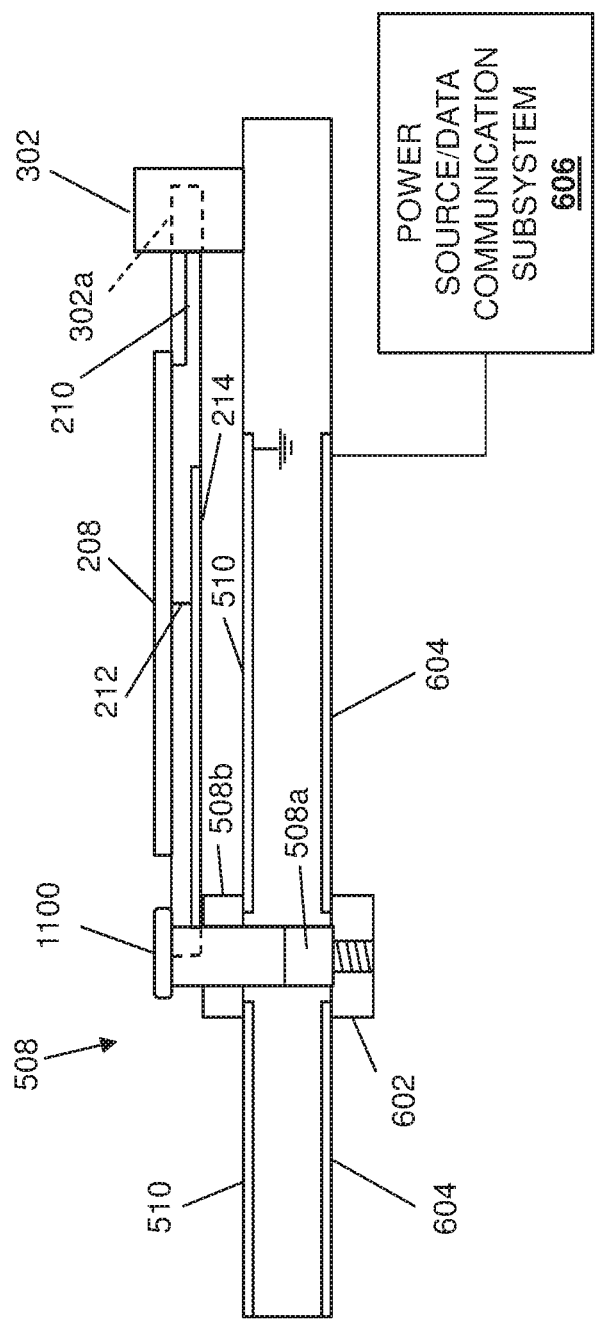
FIG. 11 is a side schematic view illustrating an embodiment of a conventional expansion module coupled to the board of FIG. 6 having the board supplemental power delivery/data transmission subsystem.

If, at decision block 1006, it is determined that supplemental power delivery/data transmission is not desired, the method 1000 proceeds to block 1008 where a conventional coupling member engages the expansion module and a standoff on the expansion module coupling feature. With reference to FIG. 11, in an embodiment of block 1008, a conventional coupling member 1100 may be engaged with the shared expansion module coupling feature 508 and the portion of the expansion module 200 that is located adjacent the shared expansion module coupling feature 508. For example, the conventional coupling member 1100 may be provided by a first sized screw that may be threaded with threads provided in the standoff 508b (and in some cases, the hole 508a) until a top portion of that screw engages the portion of the expansion module 200 adjacent the shared expansion module coupling feature 508 to secure that portion of the expansion module 200 between the standoff 508b and the top portion of the screw, as illustrated in FIG. 11. With that portion of the expansion module 200 secured between the standoff 508b and the conventional coupling member 1100, the ground connector pad 214 in the expansion module 200 is connected to the ground connector pad 510 in the board 500 through the standoff 508b in order to ground the expansion device 208 on the expansion module 200. As such, the expansion module 200 may only receive power and transmit data conventionally via the power delivery channels and data transmission channels in the expansion module connector 302. It is noted that the conventional coupling member 1100 does not engage the supplemental power delivery/data transmission feature 602.

Figure 12:
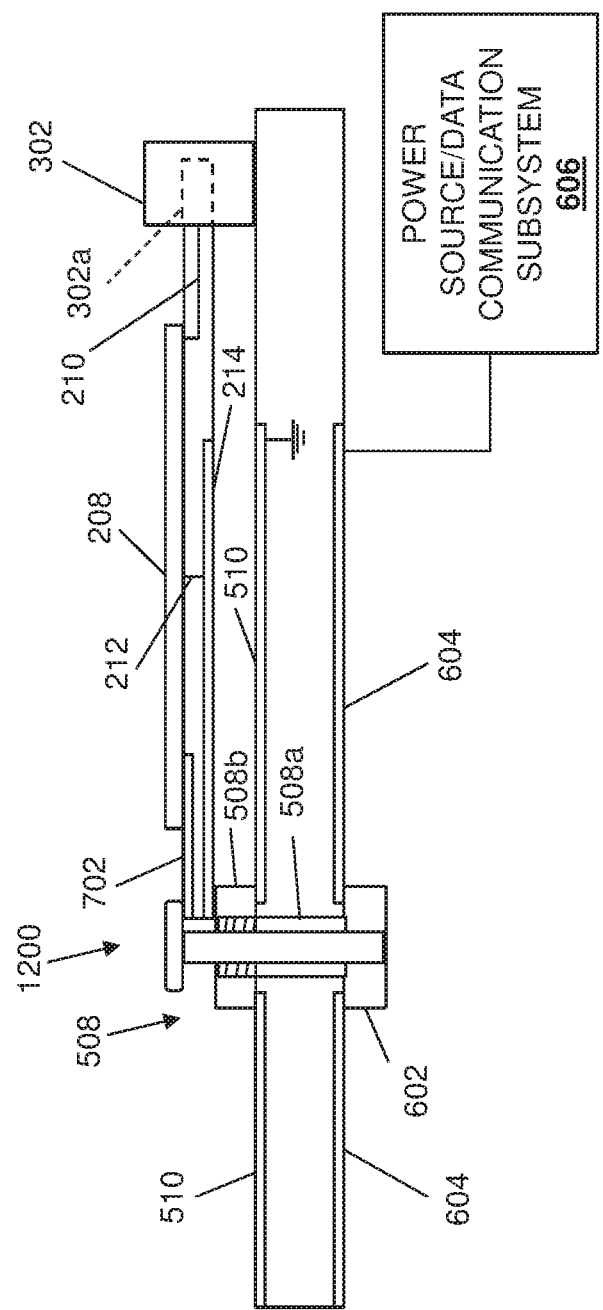
FIG. 12 is a side schematic view illustrating an embodiment of the expansion module of FIG. 7 coupled to the board of FIG. 6 having the board supplemental power delivery/data transmission subsystem.

If, at decision block 1006, it is determined that supplemental power delivery/data transmission is desired, the method 1000 proceeds to block 1010 where a supplemental power delivery/data transmission coupling member engages the expansion module and an supplemental power delivery/data transmission coupling feature. With reference to FIG. 12, in an embodiment of block 1010, a supplemental power delivery/data transmission coupling member 1200 may be engaged with the supplemental power delivery/data transmission coupling feature 302 and the portion of the expansion module 700 that is located adjacent the shared expansion module coupling feature 508. For example, the supplemental power delivery/data transmission coupling member 1200 may be provided by a second sized screw (e.g., with a smaller diameter first sized screw utilized for the conventional coupling member 1100 in the example above) that may be threaded with threads provided in the supplemental power delivery/data transmission feature 602 until a top portion of that screw engages the portion of the expansion module 700 adjacent the shared expansion module coupling feature 508 to secure that portion of the expansion module 700 between the standoff 508b and the top portion of the screw, as illustrated in FIG. 12. With that portion of the expansion module 700 secured between the standoff 508b and the supplemental power delivery/data transmission coupling member 1200, the ground connector pad 214 in the expansion module 200 is connected to the ground connector pad 510 in the board 600 through the standoff 508b in order to ground the expansion device 208 on the expansion module 700. In addition, the supplemental power delivery/data transmission coupling member 1200 engages the supplemental power delivery/data transmission feature 602 to couple the power delivery/data transmission line 702 in the expansion module 700 to the power source 606 via the power delivery/data transmission line 604 in the board 600. As such, the expansion module 700 may receive power and transmit data conventionally via the power delivery channels and data transmission channels in the expansion module connector 302, and may receive additional power and/or transmit additional data between the device 208 and the power source/data communication subsystem 606 via the connection of the power delivery/data transmission line 702 in the expansion module 700, the supplemental power delivery/data transmission coupling member 1200, the supplemental power delivery/data transmission feature 602, and the power delivery/data transmission line 604 in the board 600. It is noted that the supplemental power delivery/data transmission coupling member 1200 does not engage the standoff 508b (which is grounded as discussed above.)

Thus, systems and methods have been described that provide for the delivery of additional power and/or the transmission of additional data to an M.2 card via a secondary power delivery channel and/or secondary data transmission channel that is separate from the primary power delivery channel and primary data transmission channel provided by its M.2 card connector. In a specific example, a board with which the M.2 card is utilized may include an M.2 card coupling feature that includes a hole that extends through the board, and a standoff that is located adjacent the hole. A supplemental power delivery/data transmission feature may be mounted to the board adjacent the hole and opposite the board from the standoff, and may be electrically coupled to a power source or data communication subsystem. When the M.2 card is coupled to an M.2 card connector on the board and engaged with the M.2 card coupling feature, supplemental power delivery/data transmission may be enabled by utilizing an supplemental power delivery/data transmission coupling member that engages the M.2 card (and a power delivery/data transmission line provided on the M.2 card), along with the supplemental power delivery/data transmission feature, and without engaging the standoff. Engagement of the supplemental power delivery/data transmission coupling member with each of the power delivery/data transmission line on the M.2 card and the supplemental power delivery/data transmission feature creates a power delivery/data transmission channel for providing the additional power/data between the M.2 card and the power source or data communication subsystem.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An expansion module supplemental transmission system, comprising: a board; an expansion module connector that is mounted to the board and that includes a plurality of connector pads that are configured to transmit primary power and primary data; an expansion module coupling feature that is provided on the board and that includes a grounding member that is coupled to ground, and a supplemental transmission member that is coupled to a supplemental transmission subsystem; an expansion module that is connected to the expansion module connector such that the expansion module receives the primary power and primary data via the plurality of connector pads; and a supplemental transmission coupling member that is coupled to the expansion module coupling feature to secure the expansion module to the expansion module coupling feature, wherein the supplemental transmission coupling member engages the supplemental transmission member and does not engage the grounding member in order to allow the expansion module to receive supplemental transmissions from the supplemental transmission subsystem.

2. The system of claim 1, wherein the supplemental transmissions include supplemental data transmissions.

3. The system of claim 1, wherein the supplemental transmissions include supplemental power transmissions.

4. The system of claim 1, wherein the grounding member includes a grounding member coupling feature having a first diameter, wherein the supplemental transmission member includes a supplemental transmission coupling feature having a second diameter that is less than the first diameter.

5. The system of claim 4, wherein the supplemental transmission coupling member includes a coupling member having the substantially the second diameter such that when the supplemental transmission coupling member is coupled to the expansion module coupling feature the supplemental transmission coupling member extends through the grounding member coupling feature without engaging the grounding member and engages the supplemental transmission coupling feature to engage the supplemental transmission member.

6. The system of claim 1, wherein the expansion module configured according to the M.2 specification.

7. An Information Handling System (IHS), comprising: a board; an expansion module connector that is mounted to the board and that includes a plurality of connector pads that are configured to transmit primary power and primary data to an expansion module when the expansion module is connected to the expansion module connector; an expansion module coupling feature that is provided on the board and that includes a grounding member that is coupled to ground, and a supplemental transmission member that is configured to couple to a supplemental transmission subsystem; and a supplemental transmission coupling member that is configured to couple to the expansion module coupling feature to secure the expansion module to the expansion module coupling feature when the expansion module is connected to the expansion module connector, wherein the supplemental transmission coupling member engages the supplemental transmission member and does not engage the grounding member when coupled to the expansion module coupling feature in order to allow supplemental transmissions from the supplemental transmission subsystem to be transmitted to the expansion module when the expansion module is secured to the expansion module coupling feature.

8. The IHS of claim 7, wherein the supplemental transmissions include supplemental data transmissions.

9. The IHS of claim 7, wherein the supplemental transmissions include supplemental power transmissions.

10. The IHS of claim 7, wherein the grounding member includes a grounding member coupling feature having a first diameter, wherein the supplemental transmission member includes a supplemental transmission coupling feature having a second diameter that is less than the first diameter.

11. The IHS of claim 10, wherein the supplemental transmission coupling member includes a coupling member having the substantially the second diameter such that when the supplemental transmission coupling member is coupled to the expansion module coupling feature the supplemental transmission coupling member extends through the grounding member coupling feature without engaging the grounding member and engages the supplemental transmission coupling feature to engage the supplemental transmission member.

12. The IHS of claim 7, further comprising: a primary transmission coupling member that is configured to couple to the expansion module coupling feature to secure the expansion module to the expansion module coupling feature when the expansion module is connected to the expansion module connector, wherein the primary transmission coupling member engages the grounding member and does not engage the supplemental transmission member when coupled to the expansion module coupling feature in order to prevent supplemental transmissions from the supplemental transmission system from being transmitted to the expansion module when the expansion module is secured to the expansion module coupling feature.

13. The IHS of claim 7, wherein the expansion module is configured according to the M.2 specification.

14. A method for providing supplemental transmissions to an expansion module, comprising: connecting an expansion module to an expansion module connector that is mounted to a board and that includes a plurality of connector pads that are configured to transmit primary power and primary data to the expansion module; and coupling a supplemental transmission coupling member to an expansion module coupling feature that is provided on the board in order to secure the expansion module to the expansion module coupling feature, wherein the expansion module coupling feature includes a grounding member that is coupled to ground, and a supplemental transmission member that is coupled to a supplemental transmission subsystem; and engaging the supplemental transmission coupling member with the supplemental transmission member while not engaging the supplemental transmission coupling member with the grounding member in order to allow the expansion module to receive supplemental transmissions from the supplemental transmission subsystem.

15. The method of claim 14, wherein the supplemental transmissions include supplemental data transmissions.

16. The method of claim 14, wherein the supplemental transmissions include supplemental power transmissions.

17. The method of claim 14, wherein the grounding member includes a grounding member coupling feature having a first diameter, wherein the supplemental transmission member includes a supplemental transmission coupling feature having a second diameter that is less than the first diameter.

18. The method of claim 17, wherein the supplemental transmission coupling member includes a coupling member having the substantially the second diameter such that when the supplemental transmission coupling member is coupled to the expansion module coupling feature the supplemental transmission coupling member extends through the grounding member coupling feature without engaging the grounding member and engages the supplemental transmission coupling feature to engage the supplemental transmission member.

19. The method of claim 18, wherein the supplemental transmission coupling member is provided by a screw.

20. The method of claim 14, wherein the expansion module is configured according to the M.2 specification.

* * * * *